(12) United States Patent
Wong et al.

(10) Patent No.: US 8,125,226 B2
(45) Date of Patent: Feb. 28, 2012

(54) MILLIPEDE SURFACE COILS

(75) Inventors: Wai Ha Wong, San Jose, CA (US); Subramaniam Sukumar, Union City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 298 days.

(21) Appl. No.: 12/497,457

(22) Filed: Jul. 2, 2009

(65) Prior Publication Data

US 2011/0001479 A1 Jan. 6, 2011

(51) Int. Cl.
*G01V 3/00* (2006.01)

(52) U.S. Cl. .................................................. 324/318

(58) Field of Classification Search .......... 324/300–322; 600/410–435; 333/219–235; 343/720, 824, 343/872–873, 897, 904–911 R, 700 MS
See application file for complete search history.

(56) References Cited

U.S. PATENT DOCUMENTS

| | | | | |
|---|---|---|---|---|
| 4,881,034 A * | 11/1989 | Kaufman et al. | ............. | 324/318 |
| 5,559,434 A | 9/1996 | Takahashi et al. | | |
| 5,898,306 A | 4/1999 | Liu et al. | | |
| 6,169,401 B1 | 1/2001 | Fujita et al. | | |
| 6,285,189 B1 | 9/2001 | Wong et al. | | |
| 6,396,271 B1 * | 5/2002 | Burl et al. | ..................... | 324/318 |
| 6,661,229 B2 * | 12/2003 | Weyers et al. | ................. | 324/318 |
| 6,781,377 B2 * | 8/2004 | Marek | ........................... | 324/318 |
| 6,870,453 B2 * | 3/2005 | Schulz et al. | ................. | 335/216 |
| 6,958,607 B2 * | 10/2005 | Vaughan et al. | ............. | 324/318 |
| 7,023,209 B2 * | 4/2006 | Zhang et al. | .................. | 324/318 |
| 7,088,104 B2 * | 8/2006 | Bottomley | .................... | 324/328 |
| 7,427,861 B2 * | 9/2008 | Bogdanov et al. | ............. | 324/318 |
| 7,501,823 B2 * | 3/2009 | Nistler et al. | ................. | 324/318 |
| 7,501,828 B1 | 3/2009 | Wong et al. | | |
| 7,508,210 B2 * | 3/2009 | Morich et al. | ................. | 324/318 |
| 8,022,705 B2 * | 9/2011 | Bogdanov | ..................... | 324/318 |
| 2007/0035303 A1 | 2/2007 | Gleich et al. | | |
| 2008/0278167 A1 | 11/2008 | Vaughan, Jr. | | |
| 2009/0079432 A1 | 3/2009 | Pinkerton et al. | | |

FOREIGN PATENT DOCUMENTS

EP 1386175 B1 7/2009

OTHER PUBLICATIONS

Aktham Asfour, et al., "A new dedicated double-tuned (100 MHz-27 MHz) volume RF coil actively-decoupled form a receive-only simple-tuned (27 MHz) coil: application to the MRI experiments of hyperpolarized 129Xe in the rat brain", 2008 IEEE—Int'l Inst. Measurement Tech. Conf., May 12-15, 2008, pp. 945-950.

International Search Report and Written Opinion From Corresponding PCT Application No. PCT/US2010/040987, Feb. 28, 2011 (9 pgs).

* cited by examiner

*Primary Examiner* — Dixomara Vargas

(57) ABSTRACT

A low pass RF ladder coil, which is named as a millipede surface coil, comprises a first and a second conductor end strips running parallel to each other. A set of rung elements are placed between them, alternate rung elements are connected to the first and second strip respectively. The number and spacing of the rung elements are sufficient for resonating the coil at the desired imaging frequency. This millipede surface coil may have 100 or more rung elements. Fixed and variable capacitors are provided for separately tuning and matching the first and second mode resonant frequencies, and for coupling and impedance matching the two modes to external circuits. An active detuning is provided that detunes the ladder coil when a separate RF coil is transmitting.

17 Claims, 4 Drawing Sheets

MILLIPEDE SURFACE COILS

FIELD OF THE INVENTION

The subject work relates to the field of magnetic resonance imaging (MRI) apparatus and pertains to RF surface coil geometry for the excitation and observation of magnetic resonance signals.

BACKGROUND OF THE INVENTION

The conventional apparatus for MRI comprises a magnet producing a strong DC magnetic field Bo in the imaged object. Typically the magnet is a superconducting magnet and its axis may either be oriented vertically or horizontally, depending upon the design. Within a bore is a set of gradient coils producing a distribution of magnetic fields within the object being imaged as is required for MRI. One or more RF coils are placed near the sample to produce an RF magnetic field $B_1$ to stimulate the magnetic resonance of a given nuclear species in the object, and the same coil or a separate coil to detect any resonances that are produced in the object. The apparatus includes a RF transmitter to generate the required RF current supplied to the stimulating RF coil and a RF receiver to amplify and detect the response of the stimulated nuclei. A controller is used to control the field gradients, the RF transmitting signal the receiver response, and to collect the data and form the required image.

When a single RF coil is used, the same coil serves to produce the stimulating RF field $B_1$, and to receive the response from the nuclei. The RF coil may be a volume coil that surrounds the sample, such as a solenoid coil, a Helmholtz coil pair, a birdcage coil, or a surface coil that only partially surrounds the sample. The RF coil is switched to the RF transmitter that generates an RF pulse that, when coupled to the RF coil, stimulates the nuclei. The RF coil is then switched to the receiver that amplifies and detects the responding signal from the nuclei. Radio frequency transmission lines couple the RF coil or coils located in the magnet with the MRI apparatus located nearby outside of the magnet.

In systems with two RF coils, one is used to produce the stimulating RF field $B_1$ and the other to receive the response from the nuclei. These systems typically use a large volume coil to produce a uniform RF magnetic field over the sample volume, and a surface coil to pick up signals in the nearby region of the sample with high sensitivity. The transmitter is first pulsed on for a short time period, after which the receiver is turned on to detect the nuclear response signal. When the transmitter is on the receiver channel is partially blocked to prevent the strong transmitter signals from damaging the receiver. The problem that occurs in these systems arises from the coupling between the two coils. During transmit phase, RF fields from the transmitter coil induce voltages in the receiver coil, causing currents to flow in the receiver coil that produce additional RF fields in the object being imaged. These fields add and subtract from the RF fields of the transmitter coil causing the resulting RF field to be inhomogeneous. Also during the receive phase, signals from the nuclei are absorbed in the transmitter coil with a loss of signal power. In addition, any noise in the transmitter circuit is coupled into the receiver thereby lowering the signal to noise ratio. One way to alleviate this problem is to place the coils such that their RF magnetic fields are orthogonal. This in practice is difficult to do with a high degree of accuracy, making it desirable to find other ways to reduce these undesirable effects.

A number of authors (for example, A. Asfour et al. "Instrumentation and Measurement Technology Conference Proceedings", 2008-05-12, pages 945-950; U.S. Pat. No. 5,559,434) have shown that by actively detuning the receiver coil during the transmitter phase and actively detuning the transmitter coil during the receiver phase greatly reduces these problems. Active detuning was achieved by using a pin diode to switch in an inductive or capacitive element across some part of the transmitter or receiver coil. The switch is activated by passing or removing an externally applied bias current flowing through the pin diode as illustrated in FIG. 3 of the Asfour, et al. reference. This has been found to work, however it requires fairly large externally applied bias voltages to completely turn on or off a pin diode when large RF voltages are present. To switch off the diode the externally applied bias voltage must be sufficiently large so that in no part of the RF cycle will the RF voltage overcomes the bias voltage and momentarily turns on the diode.

In the U.S. Pat. No. 7,501,828 it is suggested to devise a circuit that employs two pin diodes that does not require any bias voltage when the detune circuit is not active. This patent describes a circuit wherein a pin diode is inserted in each lead of the reactive element used to provide the detuning. Either both cathodes or both anodes of the two pin diodes connect separate leads of the reactive element. When activated by an external voltage, both pin diodes are turned on and the reactive element is coupled to the coil and provides the detuning. When no external voltage is applied one of the diodes is always off since the RF voltage across the diodes always has the opposite polarity. The external bias voltage source is decoupled from the RF coil by radio frequency choke coils that have high impedance at RF frequencies but low impedance to the switching voltages.

A RF receiver with a surface RF coil is particularly applicable to the imaging of small animals. To observe the magnetic resonance signals with the highest sensitivity the coil structure must be placed very close or perhaps in contact with the region of the object or animal being studied can provide the high filling factor and high sensitivity. The same RF coil or a different RF coil may serve as the transmitter coil.

One variation of a surface coil is described in U.S. Pat. No. 5,898,306. This patent describes a surface coil in the form of two coupled ladder resonator coils, with a first mode circuit path for detecting or generating magnetic flux in a vertical axis from the surface of the coil and a second mode circuit path for detecting or generating magnetic flux in a parallel to the surface of the coil, with the first mode and second mode currents 90 degrees out of phase. The design features fixed capacitors in the resonator rungs with the rungs coupled together by inductors forming a low-pass design.

U.S. Pat. No. 6,169,401 describe a flexible open quadrature high-pass ladder structure RF surface coil in magnetic resonance imaging. This design includes a central rung having a capacitive element Cv disposed symmetrically about a midpoint, and a like number of additional rungs are disposed parallel to and symmetrically on opposite sides of the central rung. The side elements include fixed capacitive elements Ca, which interconnect adjacent ends of each of the rungs forming a high-pass circuit. Both of these patents require fixed capacitors either in series with the rung elements or between rung elements, which because of their size, cause problems particularly in surface coils for the imaging of small animals. In addition fixed capacitors typically have a different magnetic susceptibility that the surrounding region thereby causing unwanted gradients in the DC magnetic field Bo.

SUMMARY OF THE INVENTION

The present invention realizes a surface coil featuring a high density of rungs thereby achieving increased RF field homogeneity and improved RF conductivity, and without the need of a fixed capacitor associated with each rung element. This is extremely important for small animal imaging where there is insufficient space to accommodate the introduction of even small size chip capacitors. Another advantage of the present invention is that the coil array is fixed to a flexible insulating material and can be shaped to fit closely to the contour of the region of the object that is to be imaged or studied. By using many closely spaced electrically conducting elements the distributed capacitance between adjacent rung elements is sufficient to provide resonance at or near the desired operating frequency thereby eliminating the need for fixed capacitors in series with each rung element.

In prior art RF coil designs suitable for imaging animals such as rats and mice, the number of rung elements is less than 10. Although the authors argued that the design could be extended to a larger number of elements, the statement is not supported with any kind of explanations or suggestions for such implementation. In fact, the prior arts designs are based on the use of lumped capacitor elements in construction. The physical size of the lumped element components limits the maximum possible number of elements to 10 or less in surface coils for small animals.

The millipede surface coil of this work has a coil structure with 100 or more rung elements. The elements are similar to those used in the millipede birdcage coil disclosed in U.S. Pat. No. 6,285,189 and assigned to the assignee as the present invention. Since the coil has lots of elements or rungs, the magnetic field "hot spot" around the elements are minimized. As the result, millipede surface coils can be positioned very close to a sample to improve the filling factor and provide uniform detection sensitivity close to the sample surface. Also the distributed capacitor design of millipede surface coil helps to minimize the stray dielectric loss in the sample and to reduce the frequency shift due to the sample loading. According to an embodiment of the invention the coil can be operated in two modes, with the RF fields of the two modes being orthogonal, and can be driven in quadrature.

Means for independently tuning and matching the two modes of the millipede surface coil have been devised. Also an active detuning circuit has been devised using an inductor circuit with two pin diodes that operates in the off mode with zero bias voltage.

BRIEF DESCRIPTION OF THE DRAWINGS

The millipede surface coil can take various shapes and coupling arrangements. The drawings are for the purpose of illustration and not to be construed as limiting the invention.

DETAILED DESCRIPTION OF THE INVENTION

The RF coil used for transmitting radio frequency fields to the object or animal and/or detecting the responding RF fields from the object form the subject of this invention. The subject work is directed particularly toward coils that can be effectively used for small animals such as mice or rats, or small samples of material. To obtain the highest sensitivity the coil should be placed as close as possible to the region of the object being imaged. This might be, for example, the brain of a mouse or rat, or a small region near the surface of a larger animal or object.

Figure 1A:
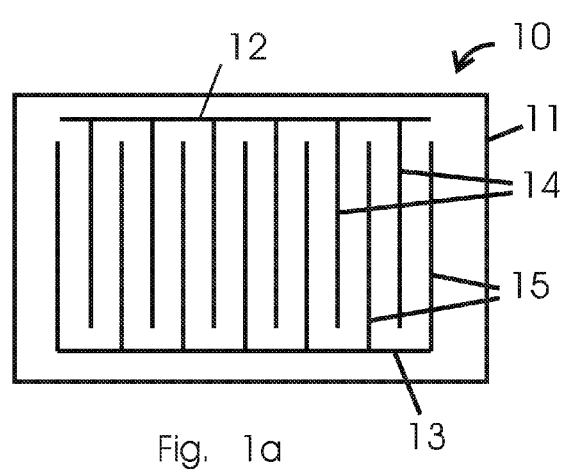
FIG. 1a illustrates the construction of a millipede surface coil according to the present work.

FIG. 1a shows a millipede surface coil 10 illustrating one aspect of the invention. The millipede surface coil 10 of FIG. 1a comprises a first electrically conducting end strip 12, and a second electrically conducting end strip 13, which is spaced apart and parallel to the first conducting end strip. Typically there are a hundred or more conducting rungs elements, 14, 15, placed between the two end strips, leading to the name "millipede surface coil". The rung elements are in the same plane as the two end strips and are oriented at right angles from the conducting end strips 12 and 13 forming a ladder structure. As illustrated in FIG. 1a, one set of rungs, 14, are electrically connected to the first conducting end strip 12, and a second set of rungs 15 are electrically connected to the second conducting end strip 13. Adjacent rung elements are connected to alternate conducting end strips. In FIG. 1a, the conducting end strip 12 with rungs 14 and conducting end strip 13 with rungs 15 are fixed to the same surface of dielectric sheet 11.

Figure 1B:
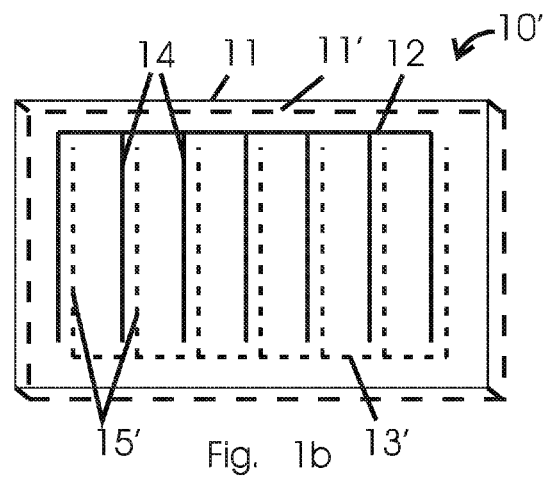
FIG. 1b illustrates an alternate construction of the millipede surface coil.

An alternative embodiment of the millipede surface coil is illustrated in FIG. 1b. In this embodiment the first conducting end strip 12 and the set of rungs 14 connected to it are on one surface of dielectric sheet 11, and the second conducting end strip 13' and the set of rungs 15 connected to it are on the surface 11' that may either be the rear surface of dielectric sheet 11 or a completely different dielectric sheet with its surface directly adjacent to dielectric sheet 11. In one embodiment each rung on surface 11' is directly behind a rung on surface of dielectric sheet 11. In an alternative embodiment each rung on surface 11' is most closely associated with two rungs on sheet 11. By selecting the position the conducting elements fixed to surface 11' the mutual capacity of the rung elements is affected and thereby the basic resonant frequency of the millipede surface coil may be selected.

No capacitors are added to the coil circuit illustrated in FIGS. 1a & 1b, the entire capacity is the self-capacity or, so-called, stray capacity between the elements of the circuit. The spacing between adjacent rungs is typically comparable to or less than the spacing from the coil to the area being imaged. This provides a high degree of RF field uniformity when the coils are used for transmitting and a high degree of spatial uniformity in the image of the object when the coils are used for receiving.

The coils can be made from flexible or rigid circuit printed circuit board material. The coil pattern is formed by standard etching methods. The preferred dielectric substrate material has low RF loss and low proton background, for example TEFLON®.

Figure 2A:
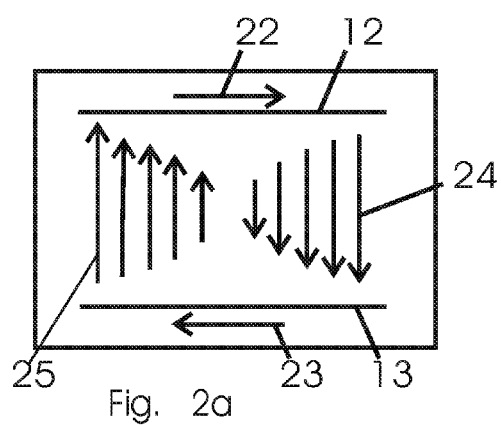
FIG. 2a illustrates the electrical current profile of the m=1 resonant mode of the millipede surface coil.

The ladder coil structure will resonate when the electrical length of the ladder structure is such that a wave propagating from one end of the structure to the other end undergoes a phase shift of m $\pi$, where m is an integer. The lowest resonant frequency occurs with m=1. When this resonance occurs the currents in the first and second conducting strips are in opposite directions as illustrated by arrows 22 and 23 of FIG. 2a. The displacement currents in the end rungs are also in the opposite directions as illustrated by arrows 24 and 25. The currents 22 and 23 are the strongest at the center of the ladder structure.

Figure 2B:
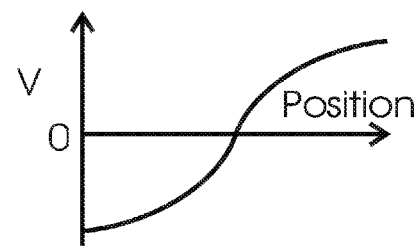
FIG. 2b illustrates the voltage profile of the m=1 resonant mode of the millipede surface coil.

The RF voltage under the m=1 resonant condition is sketched in FIG. 2b. The RF voltage, V, between the first and second end strips is plotted as a function of position along the strips. The RF voltages are maximum and 180 degrees out of phase with respect to each other at the two end rungs. The RF voltage goes through zero at the center of the structure.

Figure 3A:
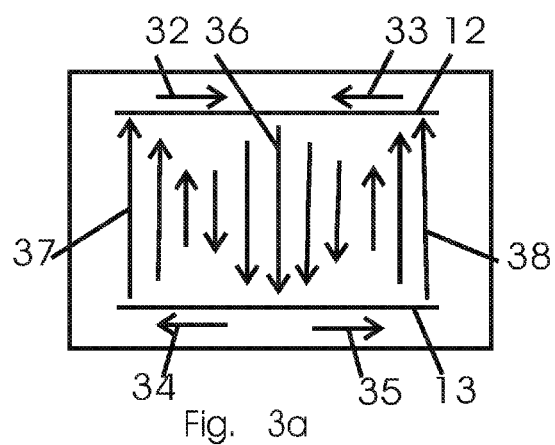
FIG. 3a illustrates the electrical current profile of the m=2 resonant mode of the millipede surface coil.

FIG. 3a illustrates the currents in the coil structure at the next to lowest resonant frequency. The frequency of this mode with m=2 is considerably higher than the lowest resonant frequency. At this resonance the currents in the first end strip are illustrated by arrows 32 and 33 and the currents in the second end strip by arrows 34 and 35. The vertical arrows in FIG. 3a illustrate the displacement currents in the rungs. Note the displacement currents at the two ends, 37 and 38, are large and of the same phase. The displacement current at the center, 36, also large but of reversed phase.

Figure 3B:
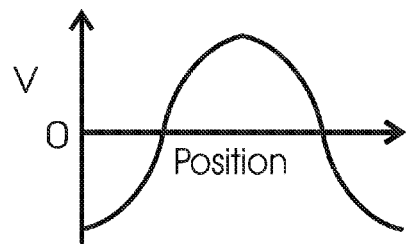
FIG. 3b illustrates the voltage profile of the m=2 resonant mode of the millipede surface coil.

FIG. 3b illustrates the voltage between the RF voltage between the first and second end strips as a function of position along the strip for the m=2 mode. The RF voltages are large and of the same phase at the two end rungs and also large but of opposite phase at the center of the rung structure.

With a flexible dielectric sheet, the millipede surface coil as described above can be fit to the surface topology of an animal or region of the object being imaged, thereby providing a higher filling factor and greater sensitivity. If the surface of the region to be imaged is planar, a planar coil fixed to a rigid dielectric sheet can be applied directly to the surface region. In other applications it may be desirable to fix the coil to rigid dielectric sheet of some other shape to better match the surface contour of the object being studied.

Figure 4:
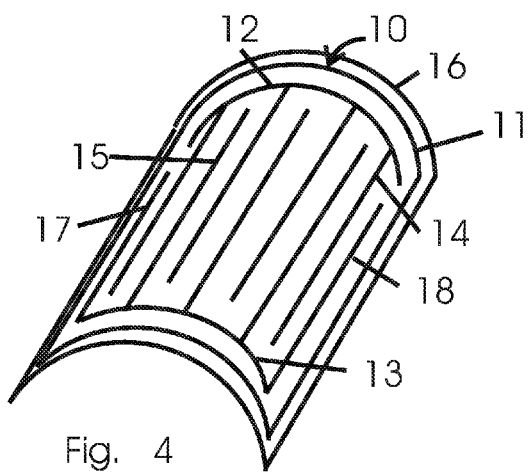
FIG. 4 is a prospective view of a millipede surface coil in the shape of a partial cylinder with the rungs of the coil parallel to the axis of the cylinder.

For many small animal applications a cylindrical shape approximates the surface of the region to be imaged. In this application the millipede surface coil as described above may be supported on a rigid dielectric cylinder that closely conforms to the shape of the region of the object to be imaged as illustrated in FIG. 4. In this embodiment the coil 10 or 10' of FIG. 1a or 1b is fixed to the surface of a rigid cylindrical shell, 16 of FIG. 4. The end rungs 17 and 18 may be separated along the arc of the cylinder so the region between corresponds to the region of the object to be imaged. In a preferred embodiment the coil may take the form of a half cylinder with rungs 17 and 18 separated by 180 degrees of arc.

Figure 5:
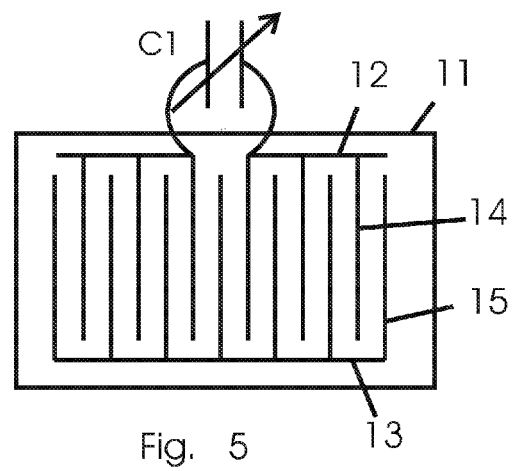
FIG. 5 is a diagram showing the circuit connection of a variable capacitor for tuning the m=1 resonant mode.

The tuning of the m=1 made can be achieved by opening a gap at the center of the first conducting end strip and inserting a variable capacitor, C1, as illustrated in FIG. 5. Since this is a region of large RF strip currents this capacitor will strongly affect the tuning of the m=1 mode. Since the RF current of the second mode with m=2 goes through zero at this position, a capacitor placed at this point will have little effect on the tuning of the second mode.

Figure 6:
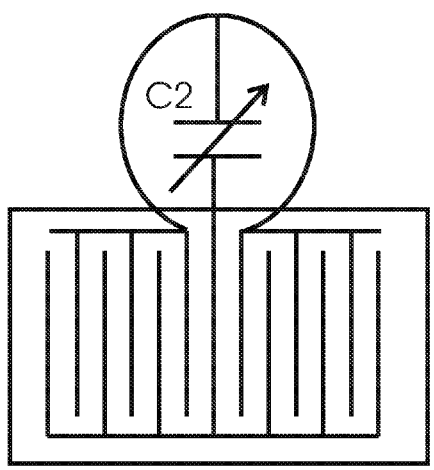
FIG. 6 is a diagram showing the circuit connection of a variable capacitor for tuning the m=2 resonant mode.
Figure 7:
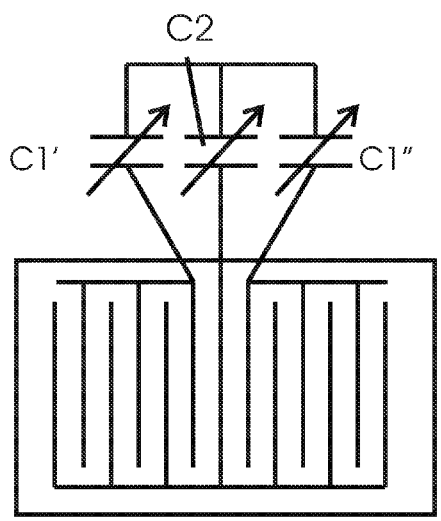
FIG. 7 is a diagram showing the circuit connections of variable capacitors for the independent tuning both the m=1 and m=2 resonant modes.

The tuning of the m=2 mode can be achieved by adding a variable capacitor C2 between the first conducting end strip and middle rung element connected to the second conducting end strip as illustrated in FIG. 6. Since the RF voltage between the strips is high in this region, this capacitor will have a strong effect upon the tuning of the m=2 mode. The RF voltage of the m=1 mode passes through zero in this region, a parallel capacitor between the strips will have little effect upon the tuning of the m=1 mode. In applications where the two modes are operated in quadrature at the same frequency the combined tuning circuit illustrated in FIG. 7 is used. Here the variable capacitor C1 of FIG. 5 is replaced by the series combination of variable capacitors C1' and C1", each with double the capacitance of C1. Capacitors C1' and C1" may be ganged variable capacitors thereby maintaining tuning independence of the two modes. The tuning of each mode is relatively independent of the other since variable capacitor C1 for tuning the m=1 mode is at a position of no mode m=2 current flow, and the variable capacitor C2 for tuning the m=2 mode is in a position where little or no m=1 mode RF current flows.

Figure 8:
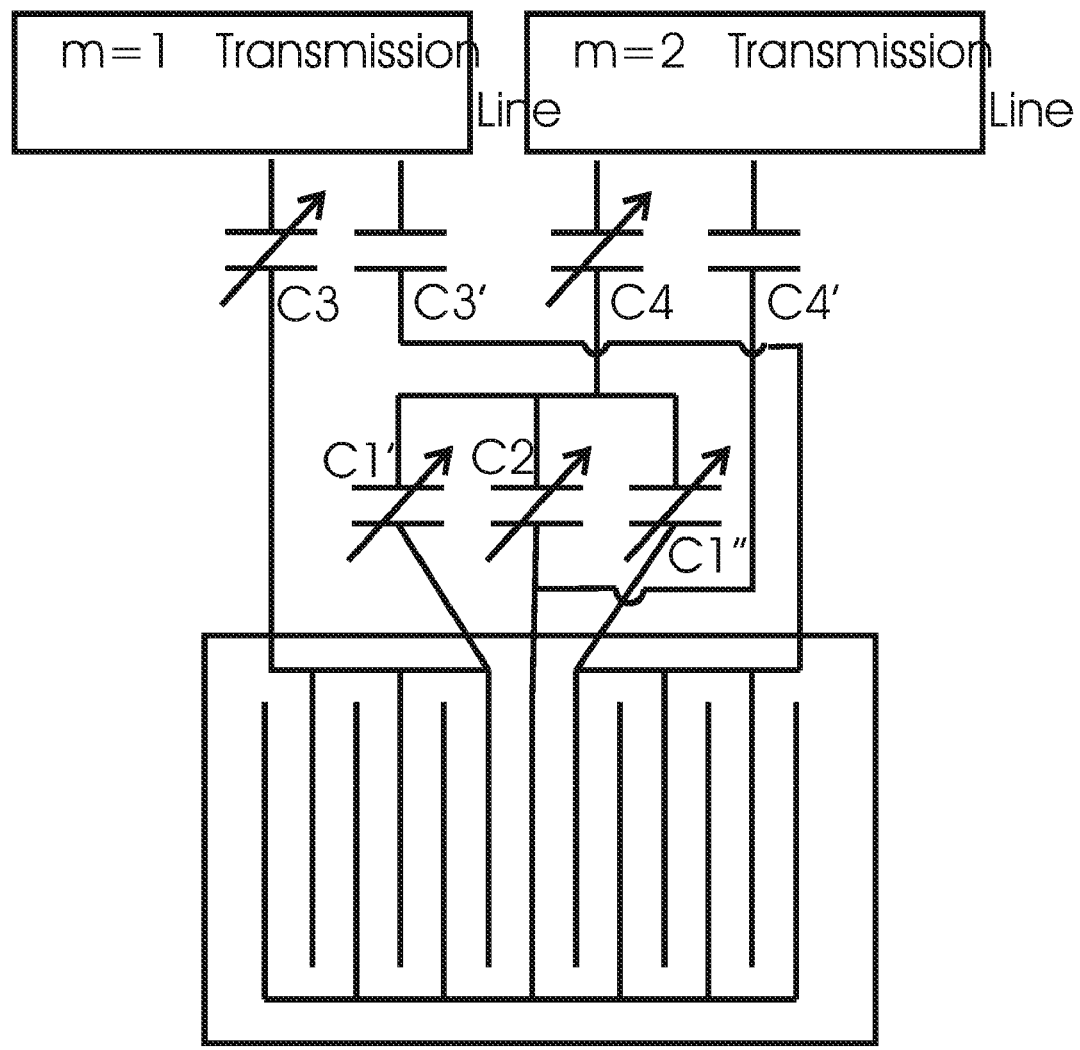
FIG. 8 is a diagram showing the circuit connections of capacitors for tuning and matching the m=1 and m=2 resonant modes and to coupled the millipede surface coil to the MRI control and display apparatus.

One method of coupling and matching to the modes of the coil to the transmission lines leading to the MRI control and display unit is illustrated in FIG. 8. The variable capacitor C3 and fixed capacitor C3' control the coupling of the m=1 mode signals and variable capacitor C4 and fixed capacitor C4' control the coupling of the m=2 mode signals.

Figure 9:
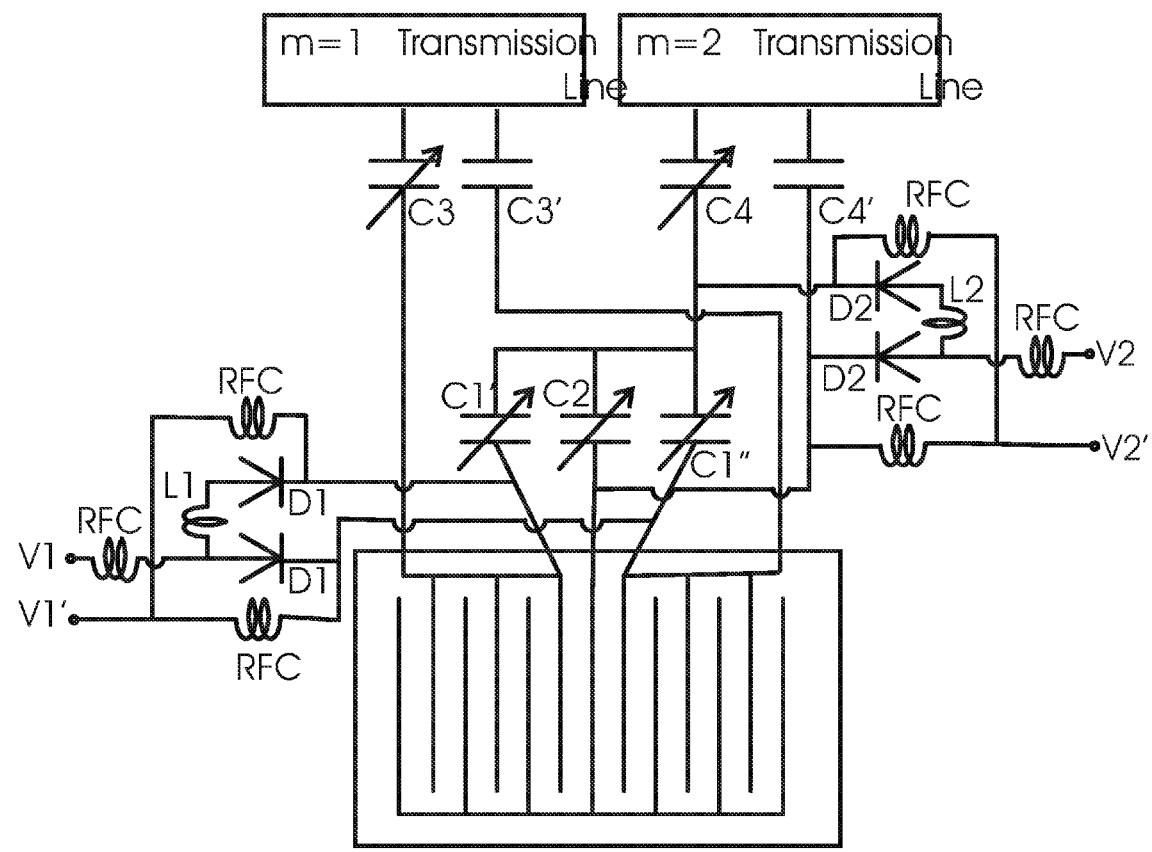
FIG. 9 is a diagram of a circuit that includes separate active detuning circuit means for independently detuning the m=1 and m=2 resonant modes.

FIG. 9 illustrates an active detuning circuit compatible with the millipede surface coil of this invention. The circuit of FIG. 9 employs two active switching circuits, one for mode m=1 and one for mode m=2. Each active switch employs two pin diodes as explained below. When the millipede surface coil is used as a receiver coil, which is the more usual case, it is actively detuned during the transmit period, thereby reducing or eliminating any RF currents in the receiver coil, that as explained above cause the RF field produced by the transmitter coil to be inhomogeneous. During the receive phase the active RF switch must be completely off.

The m=1 mode detuning is achieved by effectively switching coil L1 across the series capacitor combination of C1' and C1". This achieved by applying a positive bias voltage on V1 relative to terminal V1' of FIG. 9, thereby turning on the two pin diodes labeled D1, thereby electrically connecting inductance L1 to be in parallel with the series capacitor combination of C1' and C1", causing the m=1 mode to tune to a higher frequency. The bias voltage should be sufficiently large to keep the diode in it conducting state through all parts of the RF cycle. Similarly by applying a positive bias voltage to terminal V2 compared to V2', inductor L2 is electrically connected across capacitor C2 thereby tuning the m=2 mode to a higher frequency. These positive bias voltages are applied to the receive coil during the transmit period, so the m=1 and m=2 mode frequencies will not resonate at the transmitter frequency thereby greatly reducing any RF current induced into the receive millipede surface coil. The RF Choke coils, labeled RFC in FIG. 9, couple the bias voltages to the pin diodes while at the same time provide high impedance at the transmitter frequency thereby isolating the bias supply RF-wise from the millipede surface coil.

During the receive phase the active RF switches for the two modes must be completely off. In the circuit of FIG. 9, when the RF voltage peak is positive on the cathode of one the D1 diodes, it is negative on the cathode of the other diode, so that even with zero applied bias voltage, one of the two diodes will always be in the non-conducting state. Thus the bias voltage needs to be positive to detune the circuit, and zero for the circuit to be inactive, i.e. in the tuned state.

Although the designs of the millipede surface coil has been described with reference to particular embodiments and examples, other modification, variations and additions will occur to those skilled in the art in view of the above teachings. For example if the pin diodes were reversed in polarity and the bias supply voltage was also be reversed, the circuit would operate equally well. It should be understood that, within the scope of the appended claims, this invention may be practiced otherwise than as specifically described.

What is claimed is:

1. A millipede surface coil having electrically conducting elements fixed to a surface of a sheet of an insulating material and connecting to an MRI apparatus via transmission lines, said coil comprising:
a first conducting end strip disposed on the surface of the sheet of the insulating material;
a second conducting end strip disposed on the surface of the sheet of the insulating material parallel to said first conducting end strip; and
a first set of parallel conducting rung elements disposed between first and second conducting end strips, fixed to the surface of the insulating material and electrically connected to said first conducting end strip;
a second set of parallel rung elements, each being placed between a pair of conducting rungs of said first set, fixed to the surface of the insulating material, and electrically connected to said second conducting end strip,
wherein a number of parallel conducting rung elements and a spacing between adjacent rung elements are selected to provide dominant inductive and self-capacitance values to resonate the millipede surface coil at a desired operating frequency, said number of parallel conducting rung elements not interrupted by one or more lumped capacitor elements.

2. The millipede surface coil of claim 1, wherein said first conducting end strip with the first set of parallel conducting rung elements and said second conducting end strip with the second set of parallel rung elements are fixed to a front surface of said sheet of the insulating material.

3. The millipede surface coil of claim 1, wherein said first conducting end strip and first set of parallel conducting rung elements are fixed to the front surface of the sheet the insulating material and wherein said second conducting end strip and second set of parallel rung elements are fixed to a rear surface of the sheet of the insulating material.

4. The millipede surface coil of claim 1, wherein said sheet of the insulating material is a flat sheet.

5. The millipede surface coil of claim 1, wherein said insulating material is TEFLON®.

6. The millipede surface coil of claim 1, wherein said sheet of insulating material is curved.

7. The millipede surface coil of claim 6, wherein said sheet of insulating material is a partial cylinder with the rungs parallel to an axis of the cylinder and distributed along a surface of the cylinder.

8. The millipede surface coil of claim 7, wherein an angle between a first and a last end rungs along the surface of the cylinder is 180 degrees.

9. The millipede surface coil of claim 1, further comprising a variable capacitor C1, wherein said first conducting end strip is split at its center into a first and a second conducting strip segments with variable capacitance C1 electrically inserted between the two conducting strip segments at the position of the split, whereby the resonant frequency of the lowest mode with m=1 is adjusted.

10. The millipede surface coil of claim 9, wherein said variable capacitance C1 comprises two variable capacitors C1' and C1" connected in series.

11. The millipede surface coil of claim 10, further comprising an additional variable capacitor C2 with a first and a second leads,
wherein said first lead is electrically connected to a junction of series connection of variable capacitors C1' and C1", and said second lead is electrically connected to a central rung element of said second set of parallel rung elements via its unattached end being opposite to its end connected to the second conducting end strip, whereby a frequency of the next higher mode with m=2 is adjusted.

12. The millipede surface coil of claim 10, further comprising a variable capacitor C3 and fixed capacitor C3', each having a first and a second leads,
wherein the first lead of the variable capacitor C3 is electrically connected to an outer end of one of said first split segments, the first lead of fixed capacitor C3' is electrically connected to the outer end of said second split segment, and the second leads of variable capacitor C3 and fixed capacitor C3' are coupled to the transmission lines providing impedance matching of the m=1 mode resonance.

13. The millipede surface coil of claim 12, further comprising variable capacitor C4 and fixed capacitor C4', each having a first and a second leads, wherein the first lead of variable capacitor C4 is electrically connected to a junction of the three variable capacitors C1', C1" and C2, the first lead of fixed capacitor C4' is electrically connected to the second lead of capacitor C2, the second leads of variable capacitor C4 and fixed capacitor C4' are coupled to the transmission lines providing impedance matching of the m=2 mode resonance.

14. The millipede surface coil of claim 12, further comprising tuning inductor L1, two pin diodes D1 and three radio frequency choke (RFC) coils,
wherein said pin diodes D1 connect the tuning inductor L1 to the variable capacitors C1' and C1" and said three RFC coils electrically coupling external bias voltage to said pin diodes D1 while providing radio frequency isolation between an external bias voltage source and millipede surface coil,
whereby upon application of an externally applied bias voltage said pin diodes D1 become electrically conductive thereby electrically connecting tuning inductor L1 to variable capacitors C1' and C1" and detuning the m=1 mode of said millipede surface coil.

15. The millipede surface coil of claim 13, further comprising tuning inductor L1, two pin diodes D1, and three radio frequency choke (RFC) coils,
wherein said pin diodes D1 connecting tuning inductor L1 to the variable capacitors C1' and C1" and said three RFC coils electrically coupling an external bias voltage to said pin diodes D1 and providing radio frequency isolation between the external bias voltage source and millipede surface coil,
whereby upon application of the externally applied bias voltage said pin diodes D1 become electrically conductive thereby electrically connecting tuning inductor L1 to the variable capacitors C1' and C1" and detuning the m=1 mode of the millipede surface coil.

16. The millipede surface coil of claim 15, further comprising tuning inductor L2, two pin diodes D2 and three RFC coils,
wherein said pin diodes D2 connecting tuning inductor L2 to the two leads of variable capacitor C2, said three RFC coils electrically coupling the external bias voltage to said pin diodes D2 and providing radio frequency isolation between the external bias voltage source and the millipede surface coil, whereby upon application of the externally applied bias voltage said pin diodes D2 become electrically conductive thereby electrically connecting tuning inductor L2 to the variable capacitor C2 and detuning the m=2 mode of said millipede surface coil.

17. The millipede surface coil of claim 1, wherein a total number of rung elements of the first set and the second set is 100 or more.

* * * * *